(12) United States Patent
Bates et al.

(10) Patent No.: US 6,490,172 B1
(45) Date of Patent: Dec. 3, 2002

(54) CIRCUIT BOARD RETAINER

(75) Inventors: William M. Bates, Mayfield Heights, OH (US); Shawn M. Stover, Louisville, KY (US)

(73) Assignee: Numatics, Incorporated, Highland, MI (US)

( * ) Notice: Subject to any disclaimer, the term of this patent is extended or adjusted under 35 U.S.C. 154(b) by 0 days.

(21) Appl. No.: 09/577,941

(22) Filed: May 23, 2000

(51) Int. Cl.[7] .............................. H05K 7/12; H05K 7/14
(52) U.S. Cl. ........................ 361/801; 361/752; 361/759; 439/630; 211/41.17; 248/560
(58) Field of Search ................................. 361/752, 759, 361/801, 802; 439/630, 326–328, 65; 211/41.17; 248/560; 220/4.02

(56) References Cited

U.S. PATENT DOCUMENTS

| | | | | |
|---|---|---|---|---|
| 4,698,025 A | * | 10/1987 | Silbernagel et al. | 439/79 |
| 5,449,297 A | * | 9/1995 | Bellomo et al. | 439/630 |
| 5,734,558 A | * | 3/1998 | Poplawski et al. | 361/752 |
| 6,087,723 A | * | 7/2000 | Kinsman et al. | 257/727 |

* cited by examiner

Primary Examiner—Jayprakash N. Gandhi
(74) Attorney, Agent, or Firm—Reising, Ethington, Barnes, Kisselle, Learman & McCulloch, P.C.

(57) ABSTRACT

A circuit board having at least one resilient leg with a catch constructed to releasably engage a shoulder of a body to releasably retain the circuit board in the body. The circuit board may be slidably inserted into a slot of the body until the catch engages the shoulder to securely and releasably retain the circuit board within the body. Desirably, the circuit board has an outwardly extending shoulder at the end of the leg opposite the catch to limit the extent of insertion of the circuit board into the body so that the catch remains generally adjacent to the shoulder. This eliminates the play or looseness in the connection between the circuit board and body by preventing the circuit board from being significantly advanced beyond the point wherein the catch engages the shoulder.

13 Claims, 3 Drawing Sheets

CIRCUIT BOARD RETAINER

FIELD OF THE INVENTION

This invention relates generally to circuit boards and more particularly, to a circuit board constructed to be releasably held in a retainer.

BACKGROUND OF THE INVENTION

Printed circuit boards are being increasingly used in a wide variety of applications. Typically, printed circuit boards are loosely and unsecurely held in place by the wires attached to them or are loosely received in or on a frame which supports them. As an alternative, to provide a more secure connection of the circuit boards to the frame, the circuit boards may be held in place by clips or bolts separate from the circuit boards and attached to the frame. Undesirably, the unsecured and loosely arranged circuit boards are difficult to connect wires to and permit the wires once connected, to become unintentionally disconnected in use. Further, securing the circuit boards to a frame or other retainer with a separate mechanical device such as a screw, clip or the like, requires an extra assembly step and thereby greatly increases the cost to manufacture and assemble the device and the circuit board into the device.

SUMMARY OF THE INVENTION

A circuit board having at least one resilient leg with a catch constructed to releasably engage a shoulder of a body to releasably retain the circuit board in the body. The circuit board may be slidably received in a slot of the body until the catch engages the shoulder to securely and releasably retain the circuit board within the body. Desirably, the circuit board has an outwardly extending shoulder at the end of the leg opposite the catch to limit the insertion of the circuit board into the body so that the catch remains generally adjacent to the shoulder. This eliminates the play or looseness in the connection between the circuit board and body by preventing the circuit board from being significantly advanced beyond the point wherein the catch engages the shoulder.

In one embodiment, the circuit board has a single leg formed therein by cutting a slot parallel to and slightly inboard of an outer edge of the circuit board to define an inner surface of the leg. A recess or cavity may be provided in the outer edge of the circuit board, preferably inboard of each end of the leg to define the catch and the shoulder at generally opposed ends of the leg. So formed, the leg is somewhat flexible and resilient such that upon insertion into a slot of a body having a width slightly less than the width of the circuit board measured at the outermost point of the catch, the leg will flex inwardly to permit the circuit board to be received in the slot. The slot in the body has a length less than the length of the circuit board so that when the circuit board is fully inserted into the slot, the catch is received beyond the slot to engage a shoulder of the body and retain the circuit board in the body. In another embodiment, a pair of legs are formed on the circuit board with one leg adjacent each of a pair of opposed sides of the circuit board. The legs are preferably substantially identical, but mirror images of each other to provide a catch extending generally outwardly from each of the opposed sides of the circuit board. When inserted into a slot of a body, each leg preferably flexes generally inwardly until the catch of each leg is slidably inserted beyond the slot permitting the legs to return to their unflexed position so that the catch of each leg engages an adjacent shoulder of the body.

Objects, features and advantages of this invention include providing a circuit board that can be securely and releasably retained within a body, is integrally formed with a mechanism to releasably retain the circuit board in the body, does not require separate mechanisms to secure the circuit board to a body, facilitates connecting plugs or wires to the circuit board, is reliable, durable, of relatively simple design and economical manufacture and assembly, and in-service, has a long useful life.

BRIEF DESCRIPTION OF THE DRAWINGS

These and other objects, features and advantages of this invention will be apparent from the following detailed description of the preferred embodiments and best mode, appended claims and accompanying drawings in which:

DETAILED DESCRIPTION OF THE PREFERRED EMBODIMENTS

Figure 1:
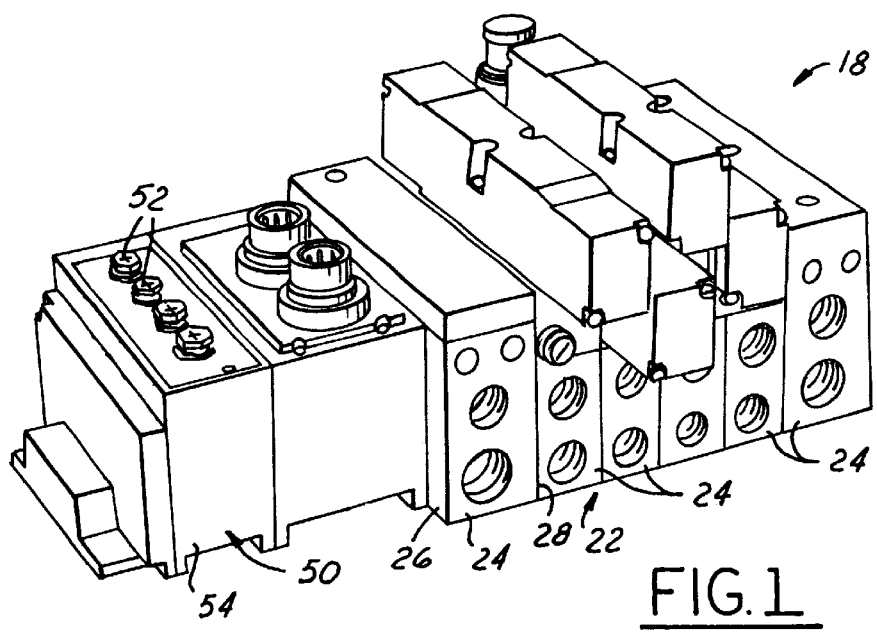
FIG. 1 is a perspective view of a fluid control system containing one or more circuit boards formed in accordance with the present invention.
Figure 2:
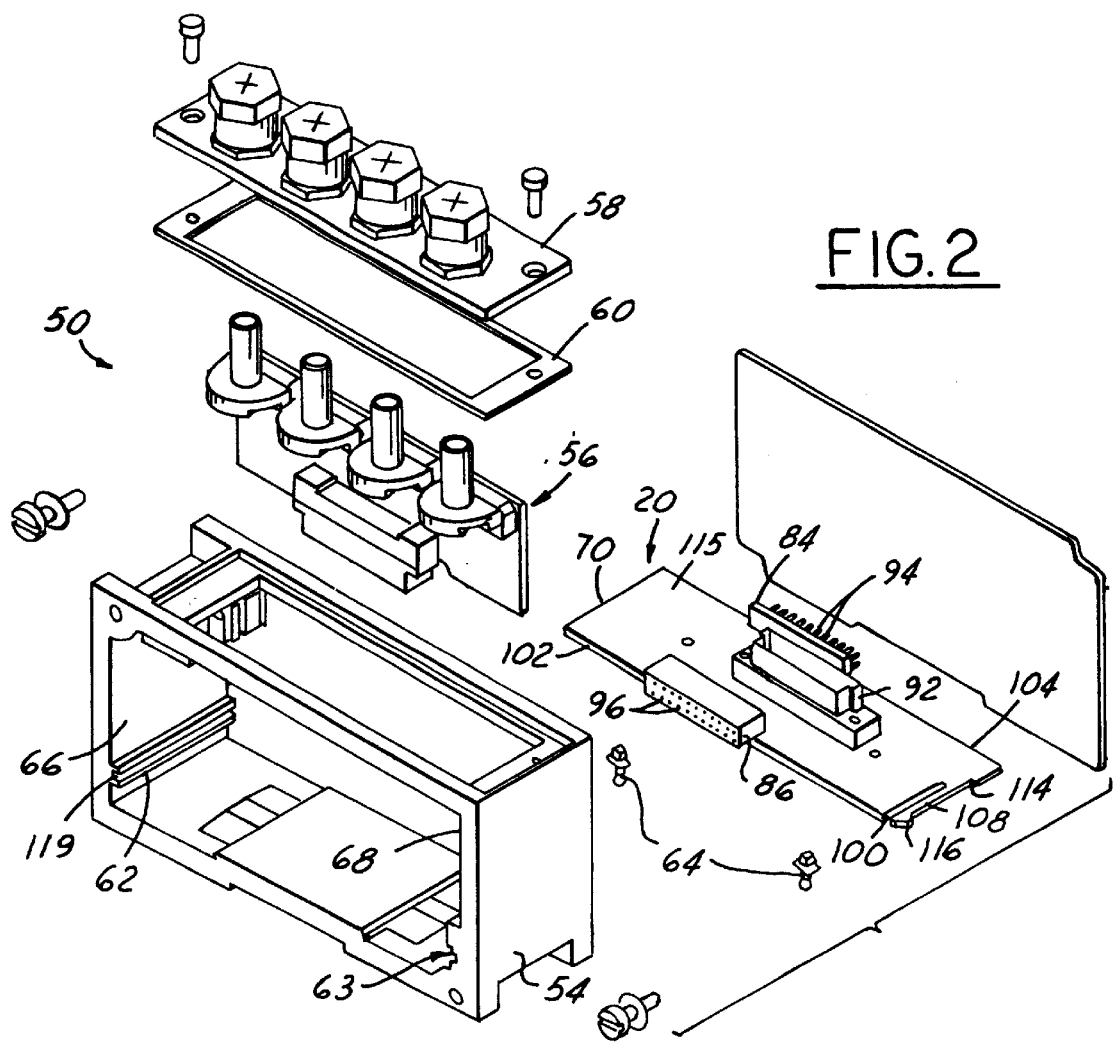
FIG. 2 is an exploded perspective view of the assembly of one manifold of the fluid control system.
Figure 3:
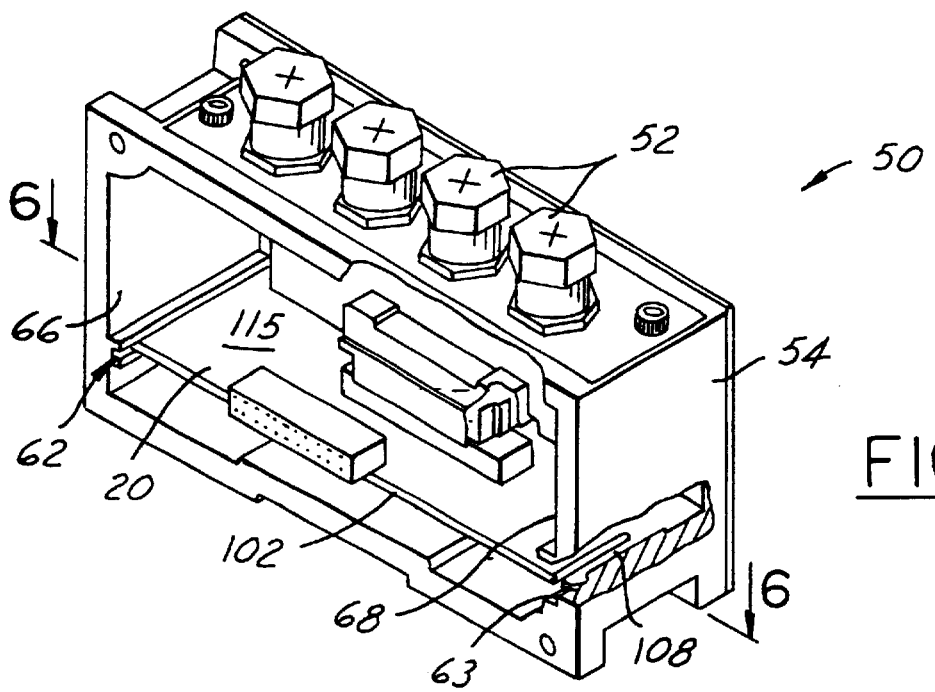
FIG. 3 is a perspective view of the assembly illustrated in FIG. 2 with a portion broken away to illustrate a leg of the circuit board.

Referring in more detail to the drawings, FIGS. 1–3 illustrate a fluid control system 18 containing circuit boards 20 in accordance with a presently preferred embodiment of the invention. The fluid control system 18 comprises a unitary manifold assembly 22 having a plurality of manifold bodies 24 with generally planer, opposed side faces 26, 28 and being interconnected face to face. The manifold bodies are preferably releasably connected together by cap screws extending through aligned openings in adjacent manifold bodies. Fluid passages extend through each manifold body 24 between the side faces 26, 28 and, in assembly of several manifold bodies 24 to form the manifold assembly 22, the passages extend longitudinally end to end through the manifold assembly 22. Preferably, gaskets (not shown) are disposed between adjacent manifold bodies 24 for sealing the fluid passages from each other and from the external atmosphere.

The control system 18 also has an input/output control module 50 with a plurality of input/output connectors 52 which either receive input signals from or send output signals to another system component. As best shown in FIGS. 2 and 3, the control module 50 has a housing 54 which receives an input/output board assembly 56, a cover plate 58 disposed on the assembly 56 with a gasket 60 between them and a circuit board 20 slidably received in opposed channels 62, 63 in the housing 54. Support pins 64 may be provided in the housing beneath the circuit board 20.

The channels 62, 63 are preferably formed in opposed sidewalls 66, 68 of the housing 54, respectively. Channel 62 of sidewall 66 has a width to closely slidably receive a corresponding edge 70 of the circuit board 20. Channel 62 may be uniform along its length to also be complimentary to the edge 70 of the circuit board it receives in assembly.

The channel 63 of at least the other sidewall 68 preferably has an entrance portion 72 (FIG. 6) which is deeper than an adjacent middle portion 74 of the channel 63 to define a shoulder 76. A downstream end 78 of the channel 63, downstream of its middle portion 74 is also deeper than the middle portion 74 to provide a second shoulder 80 in the passage immediately downstream of the middle portion 74.

As best shown in FIGS. 2–5, the circuit board 20 is a thin generally rectangular board made of any electrically insulating material suitable for use with a printed circuit thereon. The printed circuit (not shown) of each circuit board 20 is connected to a male connector 84 and a female connector 86 which plug into and receive corresponding connectors of adjacent system components. Both the male and female connectors 84, 86 are preferably connected to a third connector 92 mounted on the circuit board 20 into which the board assembly 56 is connected. To connect adjacent system components in series, pins 94 extending from the male connector 84 of one circuit board 20 are plugged into sockets 96 of the female connector 86 on the circuit board 20 in the adjacent system component. Thus, each system component may be readily electrically interconnected to permit the control system to be rapidly assembled and to avoid the need for the independent hard wiring of the individual circuit boards 20. A suitable control system and manifold assembly arrangement is described in U.S. application Ser. No. 08/980,668, the disclosure of which is incorporated herein by reference in its entirety.

In accordance with the present invention, as best shown in FIGS. 2–7, each circuit board 20 has a blind slot 100 through the board and open to a front edge 102 of the circuit board 20, terminating short of a rear edge 104 of the board and formed inboard of a side edge 106 between the front and rear edges 102, 104. The slot 100 defines a leg 108 outboard thereof which is free at one end 110 and integral at its other end 112 with the circuit board 20. An outer edge of the leg 108, which is the side edge 106 of the circuit board 20, is recessed to provide a shoulder 114 adjacent the end 112 of the leg 108 and a finger or catch 116 at the other or free end 110 of the leg 108. Desirably, the circuit board 20 is formed of a material which is at least somewhat flexible and resilient such that the leg 108 may be flexed relative to the remainder of the circuit board 20 and will return generally to its unflexed state when unrestrained or released. Preferably, the end 117 of the slot 100 is radiused or generally arcuate to prevent a crack from propagating when the leg 108 is flexed.

Figure 6:
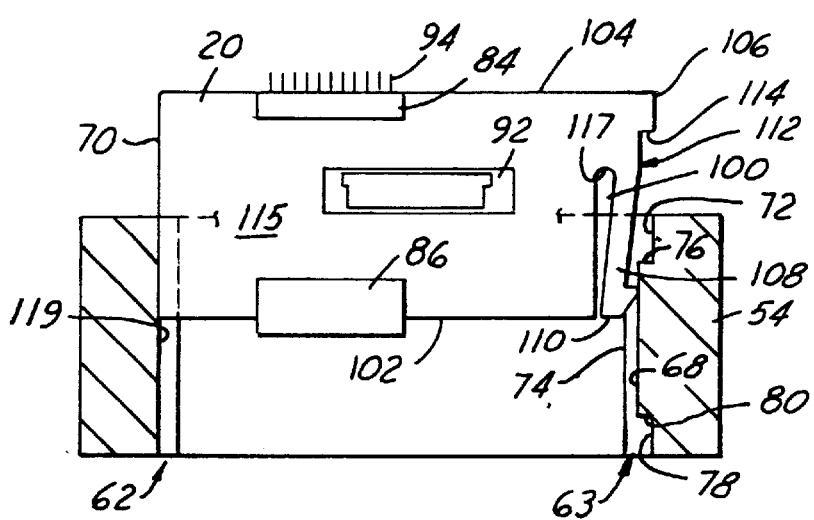
FIG. 6 is a cross-sectional view taken generally along line 6—6 of FIG. 3 and showing a circuit board partially received in the manifold body.
Figure 7:
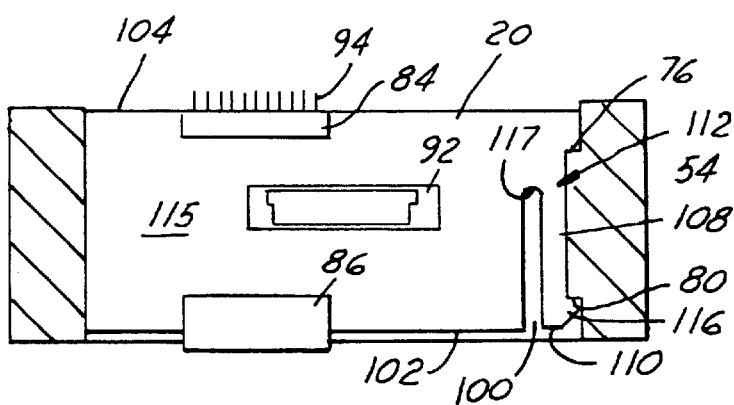
FIG. 7 is a cross-section view similar to FIG. 6 and showing the circuit board fully received in the manifold body.
Figure 4:
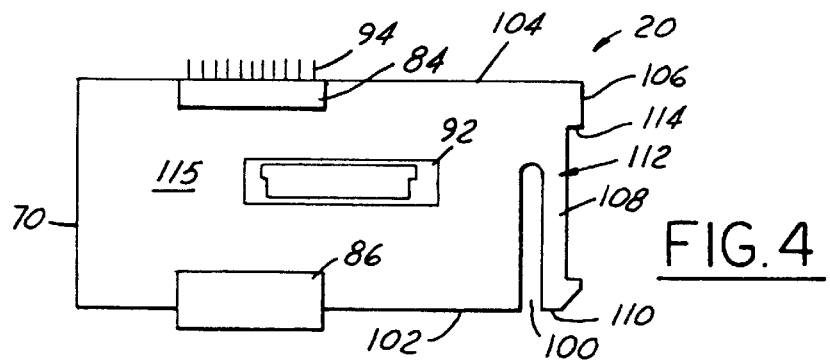
FIG. 4 is a plan view of a circuit board according to the present invention.
Figure 5:
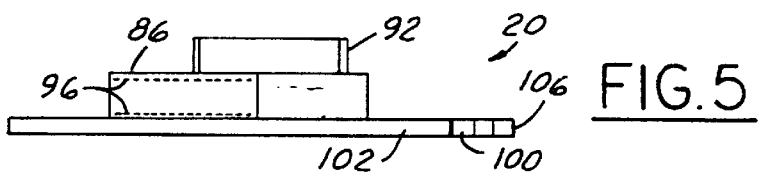
FIG. 5 is an end view of the circuit board of FIG. 4.

As shown in FIGS. 2, 3, 6, and 7, to install a circuit board 20 into a manifold body 24, the circuit board 20 is slidably received in the channels 62, 63 of the housing 54. The width or distance between the middle portion 74 of the channel 63 and the bottom 119 (FIGS. 2 and 6) of the other channel 62 is less than the width or distance from the outermost portion of the catch 116 to the opposed side 70 of the circuit board 20 such that when the circuit board 20 is inserted into the housing 54, the leg 108 is flexed generally inwardly toward the remainder or body 115 of the circuit board 20 as shown in FIG. 6. As best shown in FIG. 7, when the circuit board 20 is fully inserted into the channels 62, 63 of the housing 54, the catch 116 will be received in the downstream end 78 of channel 63 permitting the leg 108 to resiliently return to its unflexed position such that the catch 116 overlaps at least a portion of and engages the shoulder 80 of the channel 63. Also, the shoulder 114 of the leg 108 will engage the adjacent shoulder 76 in the entrance or upstream portion 72 of the channel 63 to limit the extent of insertion of the circuit board 20 into the housing 54. When so inserted, the circuit board 20 is trapped against lateral movement by the channels 62, 63 and against movement in the axial or sliding direction by the engagement of the catch 116 and shoulder 114 of the circuit board 20 with the shoulders 80, 76 in the housing 54.

Thus, the circuit boards 20 may be easily and securely installed into their respective housing 54. Also, each circuit board 20 may be released from its housing 54 by flexing inwardly its leg 108 until the catch 116 is free and clear of the shoulder 80 and then slidably removing the circuit board 20 from the housing 54 in the opposite direction from which it was inserted.

Figure 8:
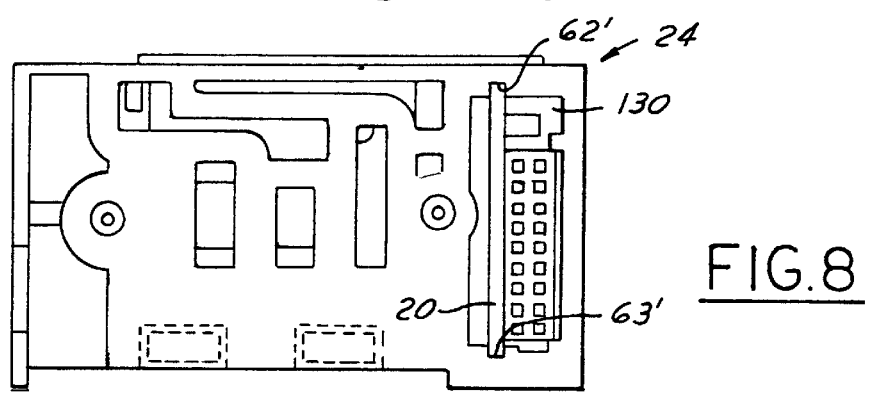
FIG. 8 is a side view illustrating a modified manifold adapted to receive a circuit board according to the present invention.

As shown in FIG. 8, the circuit board 20 may also be received in a generally vertical orientation, for example in a manifold body 24, by simply orienting a passage 130 and associated channels 62', 63' in a complementary position. In all other regards, the circuit board 20 may be the same as previously described.

Figure 9:
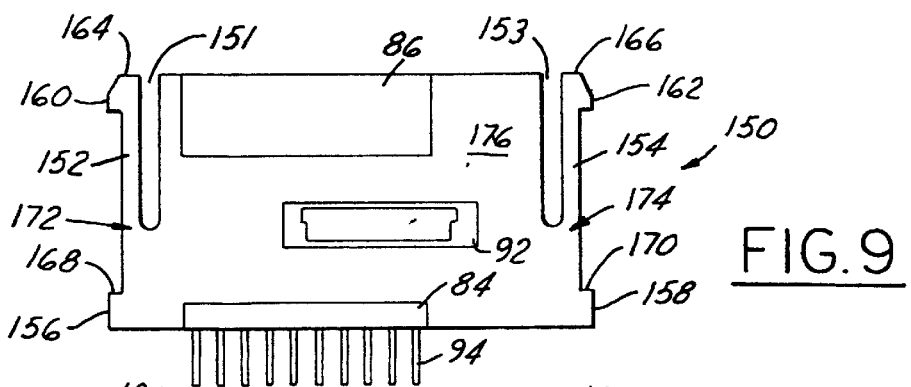
FIG. 9 is a plan view of a modified circuit board embodying the present invention.
Figure 10:
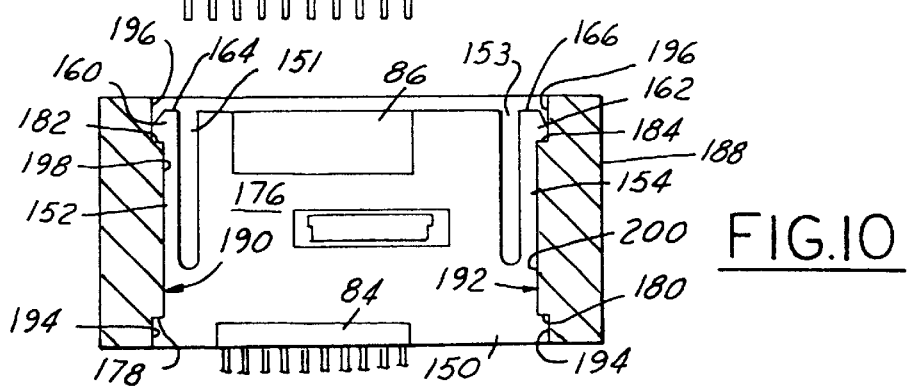
FIG. 10 is a cross-sectional view similar to FIG. 7 illustrating a circuit board according to a second embodiment of the invention received within a retainer body.

As best shown in FIGS. 9 and 10, a modified circuit board 150 may be formed having a pair of slots 151, 153 to define a pair of legs 152, 154 with one leg formed adjacent each of a pair of opposed side edges 156, 158 of the circuit board 150. Each leg 152, 154 is preferably formed in the identical manner as the leg 108 of the circuit board 20 and are preferably mirror images of the each other so that the circuit board 150 has a pair of catches 160, 162, one at a free end 164, 166 of each leg 152, 154, and a pair of shoulders 168, 170, one at the opposite end 172, 174 of each leg 152, 154, all of which extend generally outwardly of the remainder or body 176 of the circuit board 150. In all other regards, the circuit board 150 may be the same as the circuit board 20.

To provide shoulders 178, 180, 182, 184 in a housing 188 engagable with both shoulders 168, 170 and catches 160, 162 of the circuit board 150, each channel 190, 192 in the housing 188 is provided with front and rear cavities 194, 196 which define the shoulders 178-184 and corresponding middle portions 198, 200 of each channel 190, 192. The distance between the opposed middle portions 198, 200 of channels 190, 192 is less than the distance between the outermost points of the catches 160, 162. Thus, as the circuit board 150 is slidably received in the opposed channels 190, 192, the legs 152, 154 are flexed generally inwardly towards the remainder or body 176 of the circuit board 150 until, as shown in FIG. 10, each catch 160, 162 is received in the rear cavity 196 of its corresponding channel 190, 192. When the legs 152, 154 are received in the rear cavities 196, the resilient nature of the legs 152, 154 causes them to return to their unflexed position with their catch 160, 162 overlapping and engaged with a corresponding shoulder 182, 184. Further insertion of the circuit board 150 into the passage 186 is prevented by engagement of the circuit boards shoulders 168, 170 with the corresponding shoulders 178, 180 of the manifold body 186. Removal of the circuit board 150 is possible by flexing inwardly each leg 152, 154 until each catch 160, 162 is free and clear of its respective shoulder 182, 184 and then sliding the circuit board 150 out of the housing 188 in the opposite direction it was inserted.

In either embodiment, the circuit board is securely and releasably retained within its housing without the aide of any external connectors such as clips or screws. Securely and releasably connecting the circuit boards within the manifold bodies greatly facilitates the interconnection of the connectors of adjacent circuit boards to electrically connect the entire manifold assembly and eliminates the vast majority of hard wiring. The time and cost to manufacture and assemble the manifold assembly or other device containing the circuit boards is greatly reduced.

What is claimed is:

1. A circuit board constructed to be releasably mounted in a body, comprising:
   a board having a one-piece main body section constructed to receive a printed circuit thereon and having a through slot adjacent to and inboard of one edge of the main body section, open at one end of the main body section and terminating at its other end within the main body section; and
   a generally flexible and at least somewhat resilient leg which is part of and homogeneously integral with the one-piece main body section, defined at least in part by the slot and having a free end with a homogeneously integral catch constructed to releasably engage and at least partially overlap a shoulder of a body in which the circuit board is slidably received to releasably retain the circuit board within the body.

2. The circuit board of claim 1 wherein the catch is defined by a recess in said one edge of the main body section.

3. The circuit board of claim 1 which also comprises a second through slot in the main body section adjacent to and inboard of a second edge of the main body section, open at one end and terminating at its other end within the main body section, and a second generally flexible and at least somewhat resilient leg which is part of and homogeneously integral with the one-piece main body section, defined at least in part by the second slot and having a free end with a homogeneously integral catch constructed to releasably engage and at least partially overlap another shoulder of the body in which the circuit board is slidably received.

4. The circuit board of claim 1 wherein the end of the slot terminating within the main body section is generally arcuate.

5. The circuit board of claim 4 wherein the end of the slot terminating within the main body section is generally arcuate.

6. A circuit board constructed to be releasably mounted in a body, comprising:
   a main body section constructed to carry a printed circuit and having a through slot adjacent to and inboard of one edge of the main body section, open at one end of the main body section and terminating at its other end within the main body section; and
   a generally flexible and at least somewhat resilient leg of and integral with the main body section, defined at least in part by the slot and having a free end with a catch configured to releasably engage and at least partially overlap a shoulder of a body in which the main body section of the circuit board is slidably received to releasably retain the circuit board within the body, and the catch is integral with the leg and extends generally outwardly from the leg and the board.

7. The circuit board of claim 6 wherein the catch defines the outermost point of the board.

8. The circuit board of claim 7 wherein the free end of the leg may be flexed towards the main body section to reduce the distance from the outermost point of the catch to the main body section.

9. A circuit board mounting assembly, comprising:
   a mounting body having an opening and a channel defined in the opening and defining at least one shoulder, the channel having opposed sides leading to the shoulder and defining a minimum width of the channel; and
   a circuit board constructed to be at least partially received in the opening and slidably received in the channel, the circuit board having a one-piece main body, a printed circuit on the main body, an at least somewhat resilient leg of and homogeneously integral with the one-piece main body and a homogeneously integral catch of and extending from the leg, the circuit board having at rest a width greater than the width of the channel whereby, when the circuit board is slidably inserted into the channel of the mounting body, the leg flexes to reduce the width of the circuit board to permit the circuit board to be received in the channel and after passing the shoulder of the mounting body, the leg resiliently returns to its unflexed position with the catch at least partially overlapping the shoulder of the mounting body to releasably retain the circuit board in the mounting body.

10. A circuit board mounting assembly, comprising:
   a body having an opening and a channel defined in the opening and defining at least one shoulder, the channel having opposed sides leading to the shoulder and defining a minimum width of the channel;
   a circuit board constructed to be at least partially received in the opening and slidably received in the channel, the circuit board having a main body, an at least somewhat resilient leg integral with the main body and a catch extending from the leg, the circuit board having at rest a width greater than the width of the channel whereby, when the circuit board is slidably inserted into the channel of the body, the leg flexes to reduce the width of the circuit board to permit the circuit board to be received in the channel and after passing the shoulder of the body, the leg resiliently returns to its unflexed position with the catch at least partially overlapping the shoulder of the body to releasably retain the circuit board in the body;
   a second shoulder in the opening of the body upstream of the opposed sides of the channel; and
   an outwardly extending shoulder of the circuit board constructed and arranged to engage said second shoulder of the body to limit insertion of the circuit board into the body.

11. The assembly of claim 10 wherein the leg is defined at least in part by a slot through the one piece main body of the circuit board which is open at one end and terminates within the main body of the circuit board at its other end.

12. The assembly of claim 10 wherein said other end of the slot is generally arcuate.

13. A circuit board constructed to be releasably retained in a mounting body, comprising:
   a board having a one-piece body section having a printed circuit thereon and a slot through the section, adjacent to and inboard of one edge of the board, open at one end of the section and terminating at its other end within the section; and
   a generally flexible and at least somewhat resilient leg as part of and homogeneously integral with the section, defined at least in part by the slot and having a free end with a homogeneously integral catch constructed to releasably engage and at least partially overlap a shoulder of a mounting body in which the circuit board is slidably received to releasably retain the circuit board within the mounting body.

* * * * *

UNITED STATES PATENT AND TRADEMARK OFFICE
CERTIFICATE OF CORRECTION

PATENT NO.     : 6,490,172 B1
DATED          : December 3, 2002
INVENTOR(S)    : William M. Bates and Shawn M. Stover It is certified that error appears in the above-identified patent and that said Letters Patent is hereby corrected as shown below:

<u>Column 6,</u>
Line 57, delete "claim 10" and insert -- claim 11 --.

Signed and Sealed this

Twenty-second Day of April, 2003

JAMES E. ROGAN
*Director of the United States Patent and Trademark Office*